(12) United States Patent
Chen et al.

(10) Patent No.: US 8,287,941 B2
(45) Date of Patent: Oct. 16, 2012

(54) METHOD OF INCREASING BETA-PHASE CONTENT IN A CONJUGATED POLYMER USEFUL AS A LIGHT EMITTING LAYER IN A POLYMER LIGHT EMITTING DIODE

(75) Inventors: Show-An Chen, Hsinchu (TW); Hsin-Hung Lu, Hsinchu (TW); Ching-Yang Liu, Hsinchu (TW); Chih-Hao Chang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 1049 days.

(21) Appl. No.: 12/222,344

(22) Filed: Aug. 7, 2008

(65) Prior Publication Data

US 2010/0034964 A1    Feb. 11, 2010

(51) Int. Cl.
*B05D 5/06* (2006.01)
*B05D 3/10* (2006.01)
(52) U.S. Cl. .................. 427/66; 427/337; 427/340
(58) Field of Classification Search .............. 427/66, 427/337, 340
See application file for complete search history.

(56) References Cited

U.S. PATENT DOCUMENTS

2007/0138952 A1* 6/2007 Liu et al. ................. 313/506

OTHER PUBLICATIONS

Chen et al., "Polyfluorenes for Device Applications", Adv Polym Sci (2008) 212; 49-84.*
Scherf et al., "Semiconducting Polyfluorenes—Towards Reliable Structure-Property Relationships", Adv Mater (2002), 14, No. 7, 477-487.*
Peet et al. "Controlled β-Phase Formation in Poly(9,9,di-n-octylfluorene) by Processing with Alkyl Additives", Adv Mater (2008), 20, 1882-1885.*
Blondin et al., "Molecular Design and Characterization of Chromic Polyfluorene Derivatives", Macromolecules (2000) 33, 5874-5879.*
Wu et al. "Swelling-Controlled Polymer Phase and Fluorescence Properties of Polyfluorene Nanoparticles", Langmuir, Jun. 3, 2008; 24(11): 5855-5861.*
Hsin-Hung Lu et al. Self-Dopant Formation in Poly99,9-di-n-octylyluorene) Via aDipping Method for Efficient and Stable Pure Blue Electroluminescence. Advanced Materials, 2007,6pgs, Hsinchu, Taiwan R.O.C.

* cited by examiner

*Primary Examiner* — James Lin
(74) *Attorney, Agent, or Firm* — Bacon & Thomas, PLLC (57) ABSTRACT

A simple and efficient method for transforming conformation of parts of chains in the amorphous phase in a conjugated polymer to extended conjugation length (termed as β phase) is disclosed. The β phase acts as a dopant and can be termed self-dopant. The generated self-dopant in the amorphous host allows an efficient energy transfer and charge trapping to occur and leads to more balanced charge fluxes and more efficient charge recombination. For example, a polyfluorene film was dipped into a mixed solvent/non-solvent, tetrahydrofuran/methanol in volume ratio of 1:1, to generate a β-phase content up to 1.32%. A polymer light emitting diode with the dipped polyfluorene film as a light emitting layer therein provides a more pure and stable blue-emission (solely from the self-dopant) with CIE color coordinates x+y<0.3 and a performance of 3.85 cd $A^{-1}$ (external quantum efficiency 3.33%) and 34326 cd $m^{-2}$.

20 Claims, 5 Drawing Sheets

METHOD OF INCREASING BETA-PHASE CONTENT IN A CONJUGATED POLYMER USEFUL AS A LIGHT EMITTING LAYER IN A POLYMER LIGHT EMITTING DIODE

FIELD OF THE INVENTION

The present invention is related to a conjugated polymer useful as a light emitting layer in a polymer light emitting diode, and in particular to a method of increasing β-phase content in the conjugated polymer for efficient electroluminescence. Here, β-phase means ordered chain alignment having extended conjugation length.

BACKGROUND OF THE INVENTION

Molecular design of conjugated polymers for efficient electroluminescence (EL) and color tuning has long been one of the most important subjects in the development of polymer light emitting diodes (PLED) and can be carried out in two ways: by chemical and physical methods. The chemical method, involving the incorporation of charge-transport moieties on the main chain (Wu, F. I., et al., Macromolecules, 38, 9028 (2005). Kim, J. K., et al., J. Mater. Chem., 91, 2171 (1999). Liu, M. S., et al., Chem. Mater., 13, 3820 (2001)), flexible side chain (Ego, C., et al., Adv. Mater., 14, 809 (2002). Chen, X., et al., J. Am. Chem. Soc., 125, 636 (2003). Shu, C. F., et al., Macromolecules, 36, 6698 (2003)), and chain ends (Miteva, T., et al., Adv. Mater., 13, 565 (2001)), has been extensively studied for poly(phenylene vinylene)s, polyfluorenes, and other polyarylenes in order to promote balanced hole and electron fluxes and to adjust highest occupied molecular orbital (HOMO) and lowest unoccupied molecular orbital (LUMO) levels, as well as the band gap for color tuning. Taking polyfluorenes as an example, incorporation of triphenylamine in the main chain and oxadiazole in the side chain provides an improvement in the efficiency and purity of blue emission to 2.07 cd $A^{-1}$ and a Commission Internationale de l'Eclairage (CIE) value of x+y=0.29, respectively, which is the best blue fluorescence device that has been reported so far (Wu, F. I., et al., Macromolecules, 38, 9028 (2005)). However, chemical methods require elaborate synthesis. Physical methods include blending a conjugated polymer with dopants (Huang, Y., et al., Mater. Chem. Phys., 93, 95 (2005). Zhang, X., et al., Chem. Phys. Lett., 422, 386 (2006). Zhang, Y, et al., Appl. Phys. Lett., 85, 5170 (2004)), tuning a chain conformation (Chen, S. H., et al., Macromolecules, 37, 6833 (2004). Chen, S. H., et al., Macromolecules, 38, 379 (2005). Chen, S. H., et al., J. Phys. Chem. B, 109, 10067 (2005). Ariu, M., et al., Synth. Met., 111-112, 607 (2000)), and manipulating a supramolecular structure (Apperloo, J. J., et al., Macromolecules, 33, 7038 (2000)). The former involves energy transfer and charge trapping allowing an enhancement of device performance in addition to color tuning and has been studied extensively. Studies on the effects of the tuning of chain conformation on EL are scarce, but studies on the effect of the manipulation of the supramolecular structure on the photoluminescence (PL) of the blue-emitting polymer poly(9,9-di-n-octyl-2,7-fluorene) (PFO) are extensive.

Because of its highly coplanar backbone, PFO can be physically transformed by into a variety of supramolecular structures (Chen, S. H., et al., Macromolecules, 37, 6833 (2004). Chen, S. H., et al., Macromolecules, 38, 379 (2005). Chen, S. H., et al., J. Phys. Chem. B, 109, 10067 (2005). Ariu, M., et al., Synth. Met., 111-112, 607 (2000)), such as crystalline phases (i.e., α and α' phase) and noncrystalline phases (such as amorphous, nematic, and β phase, which has an extended conjugation length of about 30 repeat units, as evidenced by wide-angle X-ray diffraction (Grell, M., et. al., Macromolecules, 32, 5810 (1999))). Among these structures, β phase has attracted the most attention because of its specific physical properties, such as a lower extent of triplet exciton formation (Hayer, A., et. al., Phys. Rev. B, 71, 241302 (2005)), a reduced ability to be photobleached on the single-molecule scale (Becker, K., et. al., J. Am. Chem. Soc., 127, 7306 (2005)), and efficient energy transfer from the amorphous to the β phase (Khan, A. L. T., et al., Phys. Rev. B, 69, 085201 (2004)). β phase can be physically formed by dissolving PFO in solvents with lower solvent power and higher boiling points (Khan, A. L. T., et al., Phys. Rev. B, 69, 085201 (2004)) or in a solvent/nonsolvent mixture (for example, chloroform/methanol) (Scherf, U., et al., Adv. Mater., 14, 477 (2002)), by exposing a PFO film to solvent vapors (i.e., hexane, cyclohexane, tetrahydrofuran, or toluene) (Grell, M., et. al., Macromolecules, 32, 5810 (1999)), or by applying specific thermal treatment to a PFO film (cooling and reheating to room temperature) (Grell, M., et. al., Macromolecules, 32, 5810 (1999)). In our previous work (Hung, M. C., et al., J. Am. Chem. Soc., 127, 14576 (2005)), we reported that the use of an electron-deficient moiety (such as triazole) as an end-capper for PFO can induce a trace amount of β phase without any further physical treatment and this can be taken as a quasiphysical approach for β-phase formation. Very recently, PFO with a so-called intrinsically doped β phase has been demonstrated to be a potential material for an electrically pumped laser (Rothe, C., et al., Adv. Mater. 18, 2137 (2006)). However, the effect on device efficiency in a presence of the β phase has not been explored, probably because of complicated and time-consuming procedures for tuning β-phase content.

SUMMARY OF THE INVENTION

In the present invention, we provide a simple and efficient method for transforming conformation of parts of chains in the amorphous phase in a conjugated polymer to extended conjugation length (termed as β phase). The β phase acts as a dopant and can be termed self-dopant. The generated self-dopant in the amorphous host allows an efficient energy transfer and charge trapping to occur and leads to more balanced charge fluxes and more efficient charge recombination. In one of the preferred embodiments of the present invention, a polyfluorene film was dipped into a mixed solvent/non-solvent, tetrahydrofuran (THF)/methanol (MeOH) in volume ratio of 1:1, to generate a β-phase content up to 1.32%. As a result, relative to those in polyfluorene film without such treatment, the PLED device of the present invention provides a more pure and stable blue-emission (solely from the self-dopant) with CIE color coordinates x+y<0.3 and a better performance (3.85 cd $A^{-1}$ (external quantum efficiency 3.33%) and 34326 cd $m^{-2}$), both being the highest recorded values for pure-blue emitting devices.

A method of increasing β-phase content in a conjugated polymer disclosed in the present invention comprises contacting a film of a conjugated polymer with a mixed liquid of a solvent and a nonsolvent of said conjugated polymer for a period of time which is sufficient long so that the contacted conjugated polymer has a content of β phase higher than that of said conjugated polymer prior to said contacting.

Preferably, said contacting comprising dipping said conjugated polymer film in said mixed liquid for said period of time.

Preferably, said mixed liquid does not dissolve said conjugated polymer film to a detectable extent after said contacting.

The method of the present invention preferably further comprises depositing a layer of said conjugated polymer on a substrate before said contacting. Preferably, said depositing comprising spin coating, screen printing, doctor-blade coating, ink-jet printing or soft lithography.

Preferably, a backbone of said conjugated polymer has the following formula (I):

in which x and y are mole fractions, $0 \leq x \leq 1$, $0 \leq y \leq 1$, and x+y=1; $Ar^I$ and $Ar^{II}$ are independently selected from the group consisting of mono-, bicyclic-, and polycyclic-aromatic group; heterocyclic aromatic group; substituted aromatic group; and substituted heterocyclic aromatic group.

More preferably, $Ar^I$ and $Ar^{II}$ are independently in which $R^1$ is $C_4$-$C_{12}$ linear alkyl; m=0-4; n=0-4; o=0-2; $R^2$ and $R^3$ independently are, $C_1$-$C_{22}$ alkyl, $C_1$-$C_{22}$ alkoxy, phenyl, alkyl phenyl having $C_7$-$C_{28}$, alkoxy phenyl having $C_7$-$C_{28}$, phenoxy, alkyl phenoxy having $C_7$-$C_{28}$, alkoxy phenoxy having $C_7$-$C_{28}$, biphenyl, alkyl biphenyl having $C_{13}$-$C_{34}$, alkoxy biphenyl having $C_{13}$-$C_{34}$, biphenylyloxy, alkyl biphenylyloxy having $C_{13}$-$C_{34}$, or alkoxy biphenylyloxy having $C_{13}$-$C_{34}$; wherein substituents on the same cyclic ring structure can be identical or different, and optionally $R^1$, $R^2$, or $R^3$ is end-capped with a charge transport moiety, such as oxadiazole, triazole, carbazole, or triarylamine.

Preferably, said conjugated polymer is a homopolymer. More preferably, said conjugated polymer is polyfluorene, poly(para-phenylene), polythiophene or poly(para-phenylene vinylene).

Preferably, said conjugated polymer is a random copolymer, block copolymer or alternating copolymer. More preferably, it is a copolymer of fluorene, paraphenylene, thiophene or para-phenylene vinylene.

Preferably, said backbone of said conjugated polymer comprises a repeating unit of substituted fluorene. More preferably, said substituted fluorene is 9,9-di-n-($C_4$-$C_{12}$)alkylfluorene. Most preferably, said substituted fluorene is 9,9-di-n-octylfluorene. As to this conjugated polymer, preferably, the solvent is tetrahydrofuran and the nonsolvent is methanol. More preferably, the mixed liquid has a volume ratio of tetrahydrofuran to methanol ranging from 1:1 to 1:2. Preferably, said period of contacting time is of 10 to 600 seconds.

In the method of the present invention, said conjugated polymer before said contacting is preferably amorphous and having a not measurable β-phase content, and the contacted conjugated polymer has an increased β-phase content up to 1.32%, as estimated from an area fraction of UV-vis absorption characteristic peak.

Alternatively, said contacting comprises spraying said mixed liquid to said conjugated polymer film by spin-coating, drop-coating, screen-printing, doctor-blade coating, ink-jet printing, or soft-lithography.

The present invention also provides an improvement in a process for preparing a polymer light emitting diode (PLED) comprising forming a positive electrode on a substrate; forming a light emitting layer on said positive electrode; and forming a negative electrode on said light emitting layer, wherein said light emitting layer comprises a conjugated polymer. The improvement comprises contacting said light emitting layer with a mixed liquid of a solvent and a nonsolvent of said conjugated polymer for a period of time which is sufficient long so that the contacted conjugated polymer has a content of β phase higher than that of said conjugated polymer prior to said contacting.

Preferably, said PLED further comprises an electron transporting layer between said light emitting layer and said negative electrode.

Preferably, said PLED further comprises a hole injection layer between said positive electrode and said light emitting layer.

Preferably, said PLED further comprises a hole transporting layer between said positive electrode and said light emitting layer.

Preferably, said PLED further comprises a hole blocking layer between said light emitting layer and said negative electrode.

Preferably, in the process for preparing a polymer light emitting diode (PLED) according to the present invention, said contacting comprises dipping said light emitting layer in said mixed liquid for said period of time.

Preferably, said contacting is carried out before said negative electrode being formed on said light emitting layer. Alternatively, said contacting comprises spraying said mixed liquid to said light emitting layer by spin-coating, drop-coating, screen-printing, doctor-blade coating, ink-jet printing, or soft-lithography.

Preferably, said light emitting layer is formed on said positive electrode by spin coating, screen printing, doctor-blade coating, ink-jet printing or soft lithography.

BRIEF DESCRIPTION OF THE DRAWINGS

FIG. 1. a) Ultraviolet-visible (UV-vis) absorption and b) PL spectra of pristine PFO films dipped in a mixed THF/MeOH (volume ratio=1/2) solvent/nonsolvent for 0 (■), 10 (●), 30 (▲), 60 (▼), 180 (★), 300 (□), 420 (○) and 600 s (△) and in a mixed THF/MeOH (volume ratio=1:1) solvent/nonsolvent for 30 s (▽). The chemical structure of PFO is shown in (a) and "TBP" means para-tert-butyl phenyl end-capper. The inset in (a) illustrates the detailed evolution of the β phase and its actual content is calculated by using the spectral deconvolution method. "n.a." (not available) indicates that the exact content of the β phase is too low to be determined. c) The EL spectrum of PFO with 1.32% β phase.

DETAILED DESCRIPTION OF THE INVENTION

In the following examples, we demonstrate a novel simple physical method to generate β phase at a content of up to 1.32% in a PFO film spin-coated on a substrate by immersing it in a mixed solvent/nonsolvent for few seconds, and investigate the EL properties relevant to the β phase. The device thus prepared has a dramatically enhanced device efficiency and an increased blue-color purity of 3.85 cd A$^{-1}$ (external quantum efficiency, $\eta_{ext}$=3.33%) and CIE x+y=0.283 (less than the limit of 0.3 for pure blue), relative to that without such treatment 1.26 cd A$^{-1}$ (1.08%) and x+y=0.323. Such a high efficiency (the highest one among reported pure-blue-emitting devices) results from the special functionalities of the β phase: electron-trapping and promoted hole mobility. The β phase thus generated from PFO chains itself behaves like an external dopant and thus is termed a "self-dopant" (Ariu, M., et al., J. Phys.: Condens. Matter, 14, 9975 (2002)).

Figure 1A:
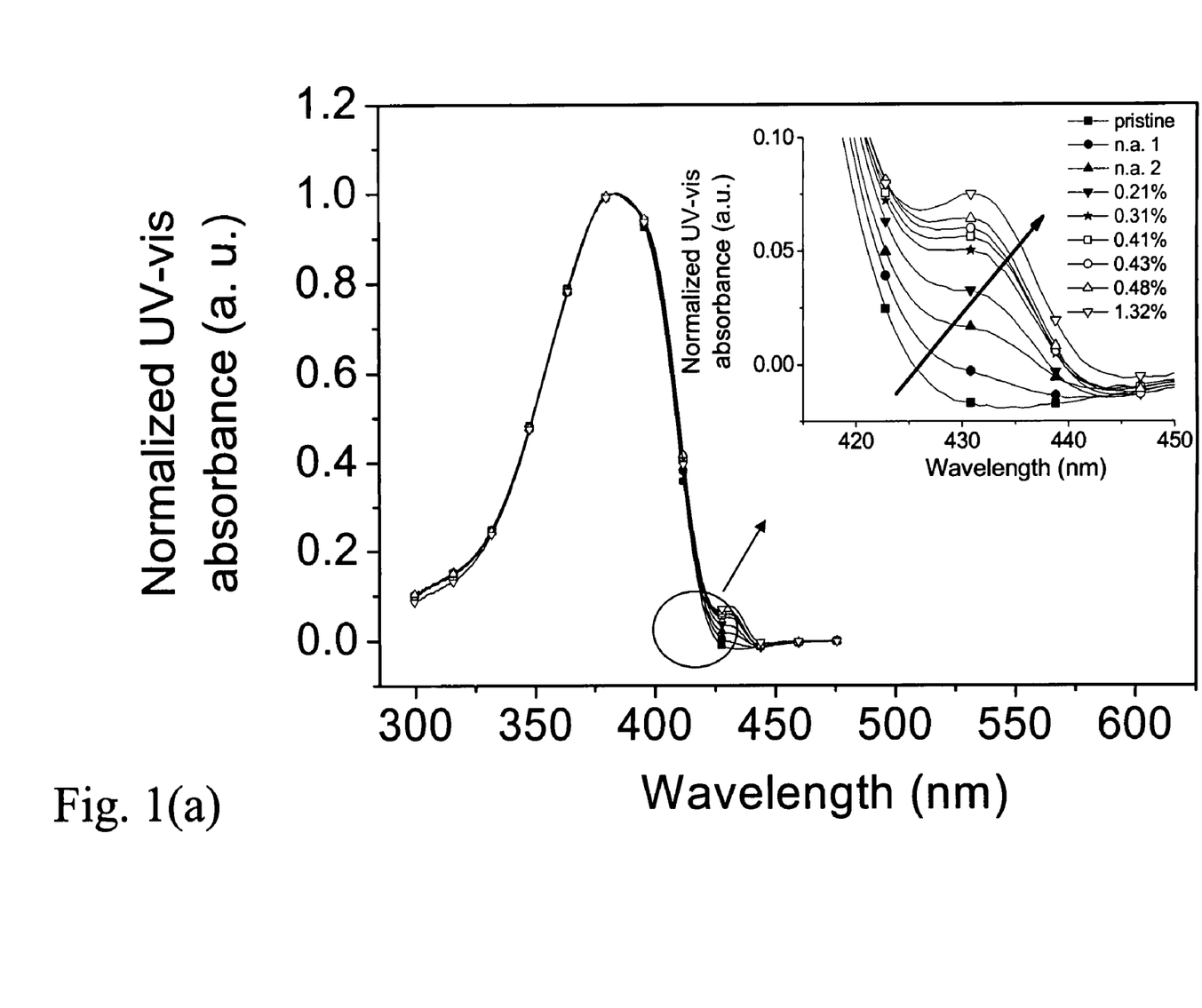
Figure 1B:
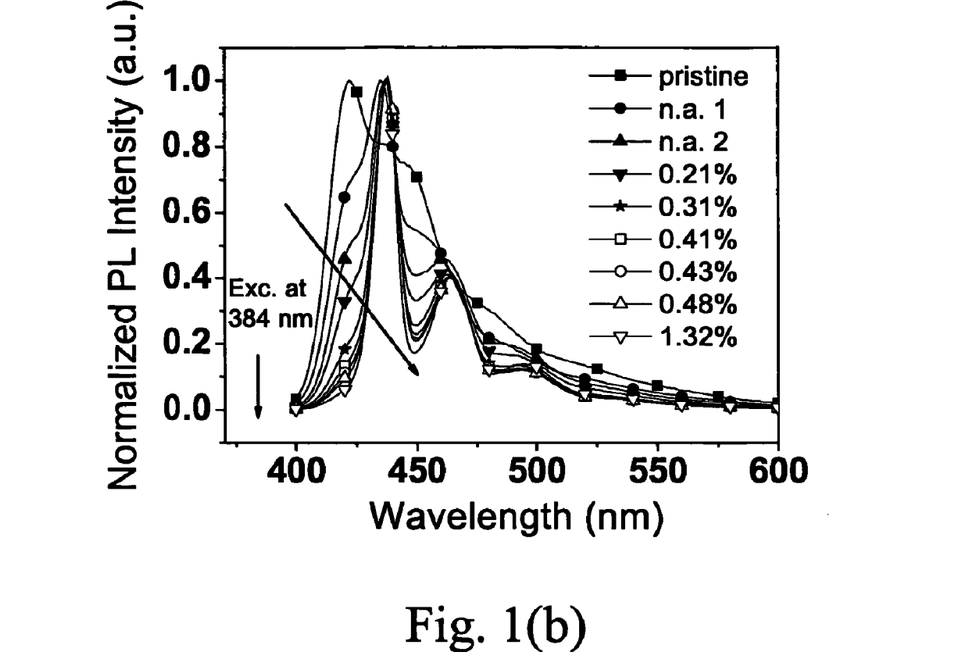
Figure 1C:
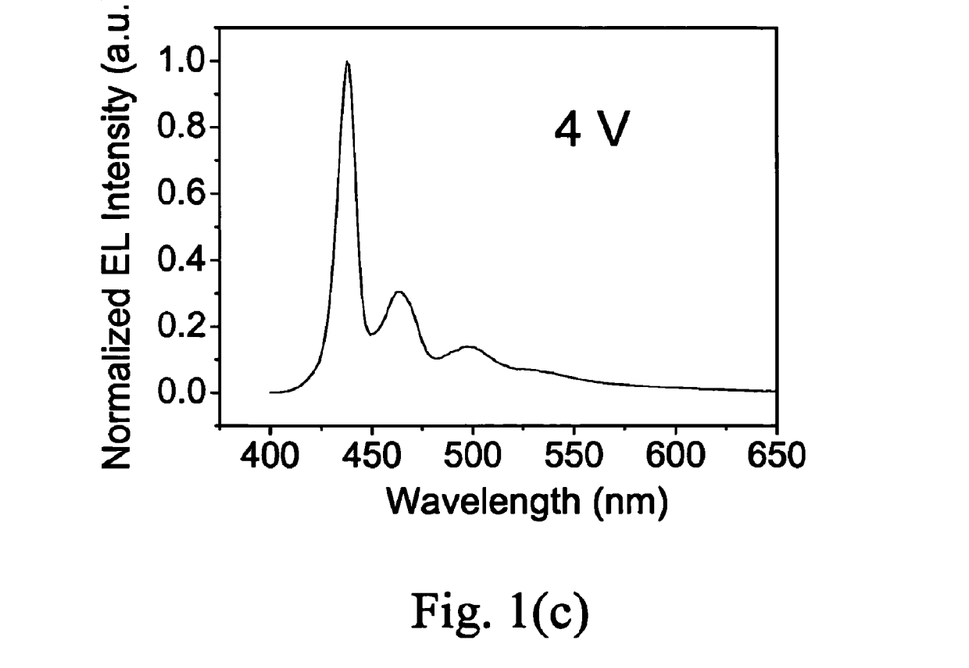

The formation of the self-dopant (β phase) in PFO is carried out by dipping PFO films spin-coated on indium tin oxide (ITO) substrate (termed as pristine PFO) in mixed solvent/nonsolvent THF(solvent)/MeOH(nonsolvent) (volume ratio 1:1 or 1:2) for various periods of time from 10 to 600 s, during which no appreciable dissolution of PFO is observed and β phase is found to generate content up to 1.32%, as estimated from the area fraction of the UV-vis absorption characteristic peak at 430 nm from spectral deconvolution (FIG. 1a and its inset) (Khan, A. L. T., et al., Phys. Rev. B, 69, 085201 (2004)). We must emphasize that 1.32% is the highest β-phase content that can be obtained by this dipping process (the longer dipping time, i.e., 60 s, in THF/MeOH (1:1) solvent did not increase the β-phase content). The corresponding PL spectra (FIG. 1b) show variations with dipping time and are composed of different ratios of amorphous-phase and β-phase emission features (Hung, M. C., et al., J. Am. Chem. Soc., 127, 14576 (2005)). The former is characterized by the wavelengths at 422 nm (strong, 0-0 band), 447 nm (moderate, 0-1 band), and 470 nm (weak, 0-2 band); and the latter with well-resolved vibronic transitions red-shifted by about 0.1 eV at 439 nm (0-0 band), 467 nm (0-1 band), and 496 nm (0-2 band) (Hung, M. C., et al., J. Am. Chem. Soc., 127, 14576 (2005). Ariu, M., et al., Phys. Rev. B, 67, 195333 (2003)). The intensity of the peak at 422 nm decreases with increasing β-phase content; as β-phase content reaches 1.32%, its PL spectrum (and EL spectrum (FIG. 1c)) exhibits a pure β-phase emission shape with the three characteristic peaks at 439, 467, and 496 nm. The formation of β phase is due to the presence of the solvent THF in the mixed solvent/nonsolvent, which can swell PFO film, allowing parts of chains to adopt a β-phase conformation as in the situation of solvent-vapor-induced β-phase formation by swelling stress (Grell, M., et. al., Macromolecules, 32, 5810 (1999)). Interestingly, even pristine PFO film contains a very small amount of β phase as indicated in the appearance of a shoulder around 438 nm in its corresponding PL spectrum, implying that β-phase-conformation chains exist even in a solution state and retain this conformation in a solid film after spin-coating (Rothe, C., et al., Phys. Rev. B, 70, 195213 (2004)).

Figure 2:
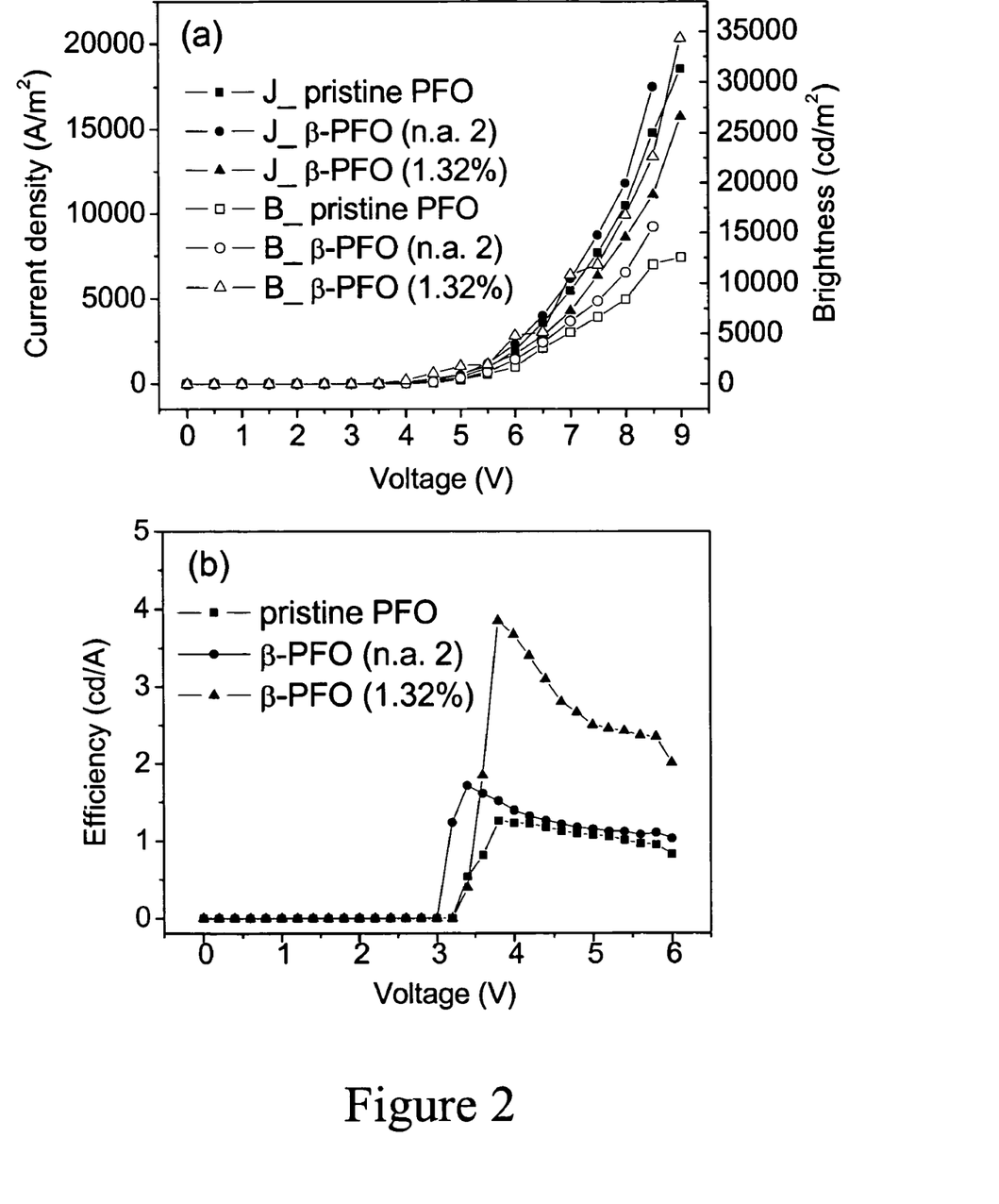
FIG. 2. a) Characteristics of current density (J) and brightness (B) versus voltage for devices based on pristine PFO and β-PFOs (n.a. 2 and 1.32%). b) The corresponding device efficiency versus voltage for these three polymers. The device structure is: ITO/PEDOT/PFOs (100 nm)/CsF/Al. (PEDOT=poly(styrene sulfonic acid)-doped poly(3,4-ethylenedioxythiophene))

Devices based on pristine PFO and PFO with n.a. 2 (n.a. means that exact β-phase content is not measurable and the number "2" denotes a specific dipping time of 30 s) and 1.32% β phase (hereafter designated as β-PFO (n.a. 2) and β-PFO (1.32%), respectively) were fabricated to study the effect of β-phase content on EL properties and device performance. EL spectra of the pristine PFO and β-PFOs (not shown in the drawings) show that the β phase not only provides blue emission with higher purity but also enhances emission stability upon cyclic operation as for β-PFO (1.32%). The weaker intensity at long wavelengths (480-650 nm) results in smaller CIE x+y values for β-PFOs, especially for β-PFO (1.32%), (0.168, 0.115) at 4 V. The better EL spectral stability could be due to linear alkyl side chains of the β-phase chains located beside fluorene units (Chunwaschirasiri, W., et al., Phys. Rev. Lett. 94, 107402 (2005)) hindering neighboring PFO main chains from getting closer and thus forming green-emission field-induced excimers (Lu, H. H., et al., Macromolecules, 38, 10829 (2005)). The other possibility is efficient Förster energy transfer from the amorphous to the β phase, which can also prevent the formation of excimers. FIG. 2a shows current-density-voltage-brightness (J-V-B) curves of devices based on pristine PFO and β-PFOs. FIG. 2b illustrates the dependence of their corresponding current efficiencies on voltage. For pristine PFO, light turn-on voltage (at a measurable brightness of 2 cd m$^{-2}$), maximum brightness, and current efficiency, are 3.4 V, 12 573 cd m$^{-2}$ (9 V), and 1.26 cd A$^{-1}$ (3.8 V and 24 cd m$^{-2}$), respectively; for β-PFO (n.a. 2), the corresponding results are 3.3 V, 15 600 cd m$^{-2}$ (9 V), and 1.71 cd A$^{-1}$ (3.4 V and 6 cd m$^{-2}$), respectively; and for β-PFO (1.32%) the corresponding results are 3.3 V, 34326 cd m$^{-2}$ (9 V), and 3.85 cd A$^{-1}$ (3.8 V and 176 cd m$^{-2}$), respectively (see Table 1). The performance from the latter device is better than the best pure-blue PLED with copolymer (Wu, F. I., et al., Macromolecules, 38, 9028 (2005)) reported in the literature.

TABLE 1

Performance and CIE coordinates of the device ITO/PEDOT/PFOs (100 nm)/CsF/Al

| Polymer | Turn-on voltage[a] (V/100 nm) | Max. brightness (cd/m$^2$) (V) | Max. efficiency[b] (cd/A) ($\eta_{ext}$ %) (V) | CIE (x, y), (x + y) at 4 V |
|---|---|---|---|---|
| pristine PFO | 3.4 | 12,573 (9 V) | 1.26 (1.08) (3.8 V) | (0.170, 0.153), 0.323 |
| β-PFO (n.a. 2) | 3.3 | 15,600 (8.5 V) | 1.71 (1.48) (3.4 V) | (0.174, 0.140), 0.314 |
| β-PFO (1.32%) | 3.3 | 34,326 (9 V) | 3.85 (3.33) (3.8 V) | (0.168, 0.115), 0.283 |

[a]Brightness at 2 cd/m$^2$
[b]Brightnesses at the max. efficiency are 24 cd/m$^2$ for pristine PFO, 6 cd/m$^2$ for β-PFO (n.a. 2), and 176 cd/m$^2$ for β-PFO (1.32%).

Figure 3:
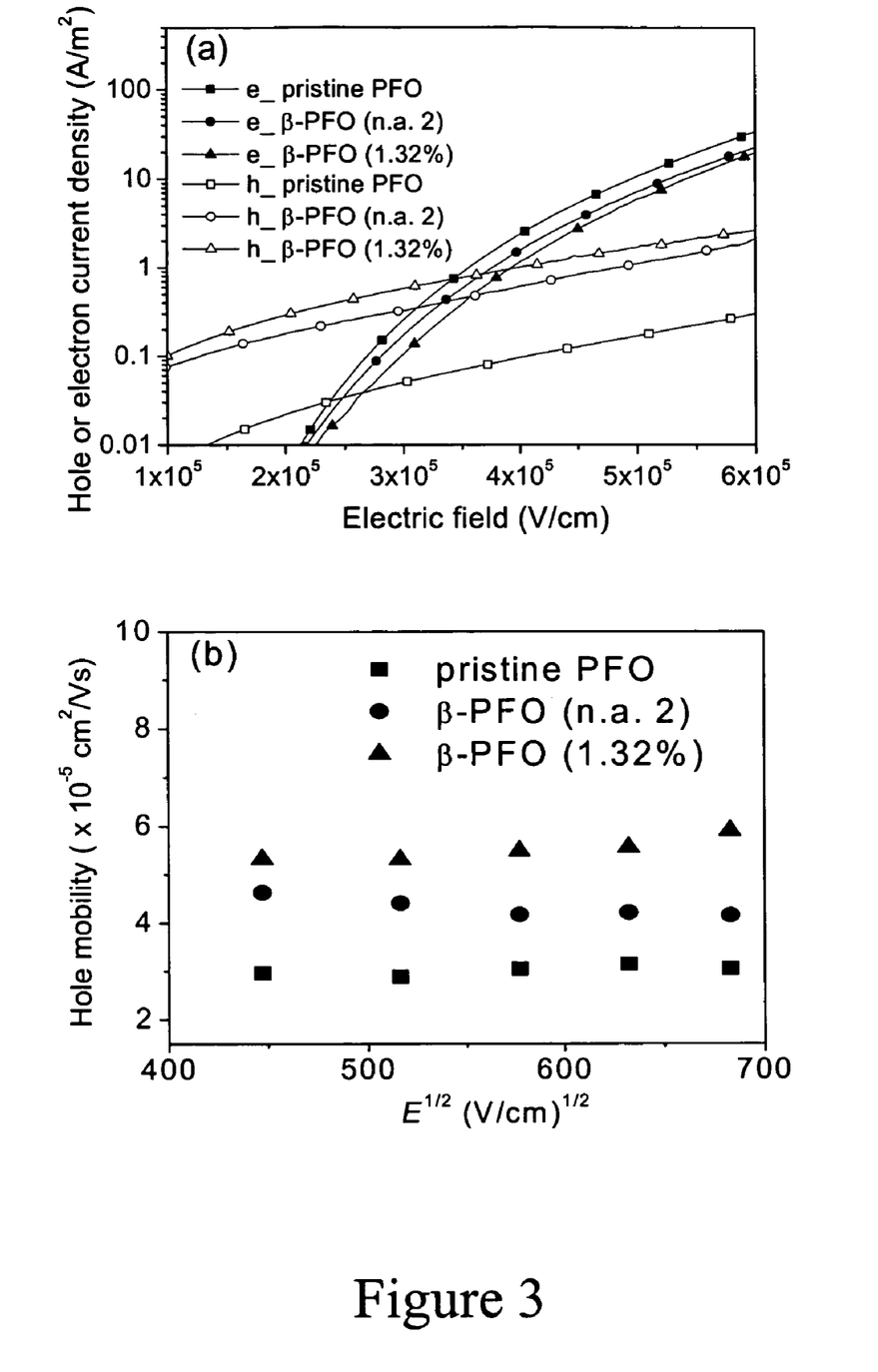
FIG. 3. a) Current densities from hole-only (h) and electron-only (e) devices based on pristine PFO and β-PFOs (n.a. 2 and 1.32%). b) Electric-field (E)-dependent hole mobilities of these three polymers.

The physics behind the high performance due to the presence of β phase is described below. Single-carrier devices of electrons and holes reveal that the hole flux increases and the electron flux decreases with increasing β-phase content, as shown in FIG. 3a. For example, the ratio of electron flux to hole flux decreases consecutively from 25.3, to 2.4, to 1.2 for pristine PFO, β-PFO (n.a. 2), and β-PFO (1.32%), respectively, at an electric field of $4\times10^5$ V cm$^{-1}$ and from 112, to 10.7, to 7.2 at $6\times10^5$ V cm$^{-1}$. The increase of hole flux is unlikely to be due to a lowering of the hole-injection barrier height ($\Phi_B$), since $\Phi_B$ values for these three PFOs are very close (being 0.15, 0.13, and 0.16 eV, respectively, as determined from ultraviolet photoelectron spectroscopy (UPS) measurements). From the result of time-of-flight (TOF) measurements for thin PFO films prepared by spin-coating in the same way as the devices (see FIG. 3b), the hole mobilities for pristine PFO, β-PFO (n.a. 2), and β-PFO (1.32%) are all electric-field dependent and the hole mobility increases with β-phase content. Their average values are $3\times10^{-5}$, $4.3\times10^{-5}$, and $5.5\times10^{-5}$ cm$^2$V$^{-1}$s$^{-1}$, respectively, over the entire range from $2\times10^5$ to $4.6\times10^5$ V cm$^{-1}$. Although the hole mobilities of β-PFO (n.a. 2) and β-PFO (1.32%) are only higher than that of pristine PFO by factors of 1.41 and 1.83, respectively, these higher hole mobilities can reduce the tendency for holes being bounced back to the anode because of an accumulation of holes at the interface with the anode, resulting in higher hole current densities of β-PFO (n.a. 2) and β-PFO (1.32%) than that of pristine PFO by factors of 6.3 and 10, respectively, at $4\times10^5$ V cm$^{-1}$. The higher hole mobility for β-PFOs comes from the longer conjugating length of β-phase chains (Chunwaschirasiri, W., et al., Phys. Rev. Lett. 94, 107402 (2005)), and this increase of hole flux can promote device efficiency and brightness because holes are minor carriers in pristine PFO.

Figure 4:
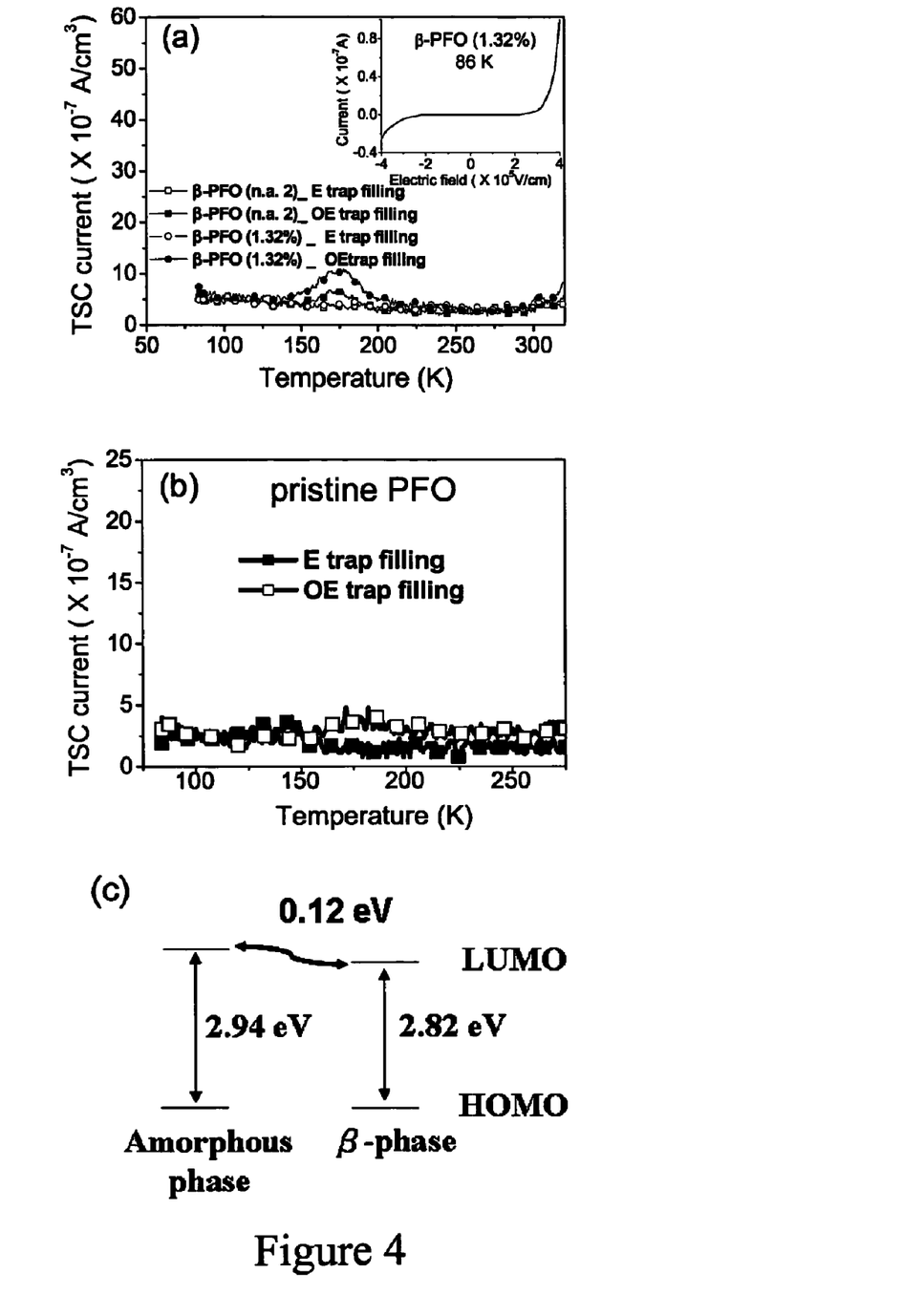
FIG. 4. a) Thermally stimulated current (TSC) measurements from 86 to 320 K for β-PFOs (n.a. 2 and 1.32%) during electrical trap filling (E trap filling, $5.3 \times 10^5$ V cm$^{-1}$) and a simultaneous optical and electrical trap filling (OE trap filling, $5.3 \times 10^5$ V cm$^{-1}$) at 86 K. The inset shows the conventional current density versus electric field at 86 K for the same β-PFO (1.32%) used in TSC measurement. b) TSC data for pristine PFO under the same trap-filling conditions as for the β-PFOs. The device structure was ITO/PFOs/Au. c) Energy-level diagram for the amorphous and β phase. Because all currents in TSC measurements are negative, their absolute values are used.

The decrease of electron flux for β-PFOs is due to β phase acting as an electron trap, as evidenced by the larger detrapping electron currents released from electron traps of PFO with higher β-phase content in the thermally stimulated current (TSC) analysis shown in FIGS. 4a and b. In the TSC analysis, trap filling with carriers was carried out either by electrical trap filling (E trap filling) or by simultaneous optical and electrical trap filling (OE trap filling) for 5 min at 86 K. By optical trap filling alone, no detrap current was observed (data not shown), which is probably due to the low extent of exciton dissociation in the absence of an applied electric field. For β-PFO (1.32%), a peak appears ranging from 143 to 203 K with a maximum at 174 K during OE trap filling (see FIG. 4a), which may result from the hole or electron detrap current (Tseng, H. E., et al., Appl. Phys. Lett., 82, 4086 (2003). Kadashchuk, A., J. Appl. Phys. 91, 5016 (2002)) or the relaxation current from chain depolarization. This current cannot result from a relaxation of depolarized chains but can be attributed to the presence of a trap, because no peak appears when the same device is subjected to E trap filling. In order to identify the polarity of the trap, we measured the current-density-electric-field characteristics of the same device used in the TSC measurement. As shown in the inset of FIG. 4a, at $3\times10^5$ V cm$^{-1}$, the current density increases dramatically meaning that holes can be injected into this device. Therefore, while applying E trap filling at an electric field of $5.3\times10^5$ V cm$^{-1}$, holes can actually be injected into this device. If hole traps do exist in this polymer film, a TSC current peak should appear during E trap filling; the absence of such a peak during E trap filling indicates that there is no hole trap in this film. Consequently, the peak that appears during OE trap filling can be rationally attributed to electron currents released from electron traps. In addition, β-PFO (n.a. 2) was also found to have electron traps because a TSC peak located between 147 and 200 K with a maximum at 174 K appeared during OE trap filling, albeit with a weaker current peak than β-PFO (1.32%), but did not appear during E trap filling (see FIG. 4a). For pristine PFO (FIG. 4b), a very weak current peak with a maximum at 174 K appeared under OE trap filling compared with those of the β-PFOs (1.32% and n.a. 2); this must also have been released from electron traps because the current released disappeared during E trap filling. Therefore, we can infer that the β phase actually acts as an electron trap and that the released electron current (reflecting trap concentration) increases with the β-phase content, that is, $1.9\times10^{-7}$ A cm$^{-3}$ for pristine PFO, $2.5\times10^{-7}$ A cm$^{-3}$ for β-PFO (n.a. 2) and $6.2\times10^{-7}$ A cm$^{-3}$ for β-PFO (1.32%), after deducting their corresponding TSC current values at 174 K during E trap filling from those during OE trap filling.

Furthermore, the absence of a hole trap current in PFO and the β-PFOs, as determined from TSC (FIGS. 4a and b), along with the same HOMO levels for the amorphous and β phase, evaluated from cyclic voltammetry (CV), and the band gaps of the amorphous phase (2.94 eV) and β phase (2.82 eV), determined from UV-vis absorption spectra allow an assignment of HOMO and LUMO levels of the β phase, as shown in FIG. 4c, in which the LUMO is located 0.12 eV below that of the amorphous phase. This trap depth is also in agreement with that obtained by fractional TSC, 0.07-0.11 eV.

Another issue that needs to be discussed is the actual distribution of the β-phase conformer in β-PFO films caused by the dipping process. Because of the limited dipping time for THF/MeOH, and hence the limited time for solvent/nonsolvent molecules to diffuse into the interior of the films, one might consider distributions of β-phase conformer in the films to be nonhomogeneous and concentrated on the film surface near the cathode. However, from the data of hole-only fluxes (FIG. 3a), the hole fluxes for β-PFO (n.a. 2) and β-PFO (1.32%) are larger than that of pristine PFO by factors of 6.6 and 11.5, respectively, at $3 \times 10^5$ V cm$^{-1}$ (even at a higher electric field of $6 \times 10^5$ V cm$^{-1}$, those factors are still as high as 6.9 and 8.8, respectively). Such a dramatic increase in hole flux along with the higher hole mobility of β-PFO indicates that β-phase conformer is homogeneously dispersed in the PFO films rather than concentrated on the film surface near the cathode. However, this issue needs to be further studied for a complete understanding of the β-phase formation produced by this dipping method.

EXAMPLE 1

Preparation of poly(9,9-di-n-octyl-2,7-fluorene)

The synthetic routes for the monomer and polymer are shown in Schemes 1 and 2, respectively.

Scheme 1

1. 9,9-di-(n-octyl)-2,7-dibromofluorene (1)

To a solution of 28.5 g (88 mmol) 2,7-dibromofluorene in 800 mL THF was added 8.8 g (220 mmol) sodium hydride (60%) in several portions at room temperature. The mixture was heated at 60° C. and 43 g (220 mmol) bromooctane in 200 mL THF was added dropwisely into the mixture and refluxed overnight. The mixture was concentrated and diluted with water, and then extracted with diethyl ether. After washing with brine, the ether solution was dried over anhydrous MgSO$_4$ and the ether was then removed by evaporation. This crude solid was purified by a silica chromography with hexane and recrystallized from ethanol to give white solid (36.3 g, yield 75.3%, mp. 52~54° C.). $^1$H NMR (500 MHz, CDCl$_3$), δ (ppm): 7.51 (2H, d), 7.44 (2H, d), 7.41 (2H, s), 1.89 (4H, m), 1.02~1.20 (20H, m), 0.81 (6H, t), 0.56 (4H, m).

2. Poly(9,9-di-n-octyl-2,7-fluorene) (PFO)

Into a reactor, bis(1,5-cyclooctadiene) nickel (0) (Ni (COD)$_2$) (195 mg, 0.71 mmol), 2,2-bipyridyl (BPY) (110.7 mg, 0.71 mmol), 1,5-cyclooctadiene (COD) (76 mg, 0.71 mmol) and anhydrous DMF (1 mL) were added in a dry box with nitrogen. This mixture was stirred at 80° C. for 30 min to form active catalyst. The monomer 9,9-di-(n-octyl)-2,7-dibromofluorene (236 mg, 0.43 mmol) in 4 mL of anhydrous toluene was added to the mixture. The polymerization proceeded at 80° C. for 6 days in the dry box, then 1-bromo-4-tert-butylbenzene as end-capping agent (9.2 mg, 0.043 mmol) was added to continually react for 24 h. The reaction mixture was left to cool down to room temperature. The resulting polymer was purified by alumina oxide chromatography, wherein the mobile phase is THF. The THF eluate was concentrated with a rotary evaporator, followed by dissolution in THF and re-precipitation in acetone/methanol (volume ratio=1:1) twice to remove oligomer. Finally the precipitate was dried under vacuum for 24 h to obtain a yellow bulky PFO. Yield: 100 mg (60%). $^1$H NMR (500 MHz, CD$_2$Cl$_2$). δ (ppm): 7.86 (d, 2H), 7.70 (br, 4H), 2.14 (br, 4H), 1.10-1.26 (m, 20H), 0.79 (t, 10H). Anal. Calcd: C, 89.69; H, 10.31. Found: C, 89.32; H, 10.19.

Scheme 2

The synthetic procedures for PFO end-capped with para-tert-butyl phenyl (TBP) used here are according to that reported in our published work (Hung, M. C., et al., J. Am. Chem. Soc., 127, 14576 (2005)). Molecular weight ($M_w$) and polydispersity index of PFO are 379,000 Daltons and 1.55, respectively, determined by gel permeation chromatography using polystyrenes as standards.

EXAMPLE 2

Dipping Procedures

PFO films (100 nm) spin-coated on ITO glass substrates from its polymer solution in THF (7.5 mg/mL) were dipped in a mixed solvent/nonsolvent (THF/MeOH with a volume ratio=1:2) for 10, 30, 60, 180, 300, 420, and 600 s to obtain different contents of β phase (n.a. 1, n.a. 2, 0.21%, 0.31%, 0.41%, 0.43%, and 0.48%, respectively). Another pristine PFO film was dipped in a mixed solvent/nonsolvent with a higher THF content (THF/MeOH with a volume ratio=1:1) for 30 s to obtain the maximum content of beta phase (1.32%); a longer dipping time (60 s) did not increase the β-phase content. Note that the mixed solvent/nonsolvent did not dissolve PFO to a detectable extent even though THF alone is a solvent.

EXAMPLE 3

Measurements on Device Characteristics and Photo-Physical Properties of poly(9,9-di-n-octyl-2,7-fluorene)

1. Device Fabrication and Characterization.

An indium-tin oxide (ITO) glass plate was exposed on oxygen plasma at a power of 30 W and a pressure of 193 mTorr for 5 minutes. A thin hole injection layer (25 nm) of poly(styrene sulfonic acid)-doped poly(3,4-ethylenedioxythiophene) (PEDOT) (Baytron P VP.AI 4083 from Bayer with a conductivity of 500-5000 S $cm^{-1}$) was spin-coated on the treated ITO. After baking at 140° C. for 1 h in an oven equipped with a glove-box filled with an argon atmosphere, a thin layer (100 nm) of the PFO prepared in Example 1 was spin-coated on top of the treated ITO from its solution in THF (7.5 mg/mL). For β-PFO (n.a. 2 and 1.32%), PFO films were dipped in mixed solvent/nonsolvents as described in the dipping procedures (Example 2) above. Finally, a thin layer of cesium fluoride (2 nm) covered with a layer of aluminum (100 nm) as a protective layer was deposited in a vacuum thermal evaporator below $10^{-6}$ Torr through a shadow mask to form a bipolar device. To fabricate the hole-only device, a layer of gold (40 nm) instead of cesium fluoride was thermally deposited on top of a PFO film without a protective aluminum layer. For the electron-only device, oxygen-plasma-treated ITO glass was deposited with a layer of aluminum (50 nm) followed by calcium (25 nm) to replace the PEDOT film, with the remaining steps the same as those for the bipolar device. The active area of the diode was about 8-10 $mm^2$. The electric characteristics and luminance of the device were measured by using a Keithley power supply (Model 238) and a luminance meter (BM8 from TOPCON), respectively. The thickness of the polymer film was measured by using a surface profiler (Tencor P-10).

2. Ultraviolet-Visible (UV-Vis) Absorption, Photoluminescence, and Electroluminescence Spectroscopic Measurements.

Films used to measure UV-vis absorption and PL spectra were obtained by spin-coating from the PFO solution in THF (7.5 mg/mL). β-PFOs (n.a. 2 and 1.32%) were obtained by following a dipping process. UV-vis absorption spectra were measured by using a UV-vis-near-IR spectrometer (Perkin-Elmer, Lambda 19). PL and EL spectra were measured by using a fluorescence spectrometer (FluoroMAX-3 from Jobin Yvon). All the measurements of the EL spectra were undertaken in a vacuum environment.

3. Ultraviolet Photoelectron Spectroscopy Measurements.

A baked PEDOT layer (25 nm) on top of an $O_2$-plasma-treated ITO glass substrate was obtained by following the same procedures as mentioned in the device fabrication section (this configuration is designated ITO/PEDOT). A thin layer (30 nm) of PFO was spin-coated on top of the ITO/PEDOT from its polymer solution in THF (4 mg/mL); for β-PFO (n.a. 2 and 1.32%); PFO films were dipped in mixed solvent/nonsolvents as described in the dipping procedures above (this configuration is designated as ITO/PEDOT/PFOs. UPS spectra of PEDOT (ITO/PEDOT) and PFOs (ITO/PEDOT/PFOs) were measured by using a photoelectron spectroscopy system (Thermo Electron Corporation) with a He I excitation line (21.2 eV) from a Helium discharge lamp under a sample bias of −2 V to magnify the secondary-electron signal (cut-off signal).

4. Thin-Film Time-of-Flight Measurements (Campbell, A. J., et al., Appl. Phys. Lett., 79, 2133 (2001). Juška, G., et al., Phys. Rev. B, 67, 081201 (2003). Tseng, H. E., et al., Appl. Phys. Lett., 84, 1456 (2004)).

A thin film (about 0.3 lm thick) of PFO was spin-coated from its solution in THF (10 mg/mL) on an ITO glass substrate in a glove-box with an argon atmosphere. For β-PFO (n.a. 2 or 1.32%), the PFO films were dipped in mixed solvent/nonsolvents as described above. Aluminum was then deposited as the charge-collection electrode by using thermal evaporation (at $10^{-6}$ Torr) through a shadow mask to achieve an ITO/PFOs/Al device structure for TOF measurements. All measurements were performed at room temperature under a vacuum of about $10^{-6}$ Torr. The photocurrent was generated by a nitrogen-laser-pumped dye laser at 390 nm with a pulse width of 500 ps through the transparent ITO electrode. In integral TOF mode (RC>$t_T$, where R, C, and $t_T$ are load resistance, capacitance of the PFO film, and transit time for a hole passing through the PFO film to the collecting electrode, respectively) (Juška, G., et al., Phys. Rev. B, 67, 081201 (2003)), the drift of holes under an applied electric field (E) were accumulated at the collecting electrode and recorded by a 500 MHz digital storage oscilloscope. The hole mobility μ was calculated from the relationship $\mu=d/t_T E$ (d is the thickness of the polymer film).

5. Thermally Stimulated Current Measurements (Tseng, H. E., et al., Appl. Phys. Lett., 82, 4086 (2003). Steiger, J., et al., Synth. Met., 129, 1 (2002)).

TSC measurements from 86 to 320 K were performed in a cryostat cooled with liquid nitrogen and a vacuum maintained at about $10^{-5}$ Torr. The TSC device (device structure is ITO/PFOs (400 nm)/Au) was installed in the cryostat and then irradiated by a xenon lamp from the ITO substrate side under an electric field of $5.3 \times 10^5$ V $cm^{-1}$ (i.e., a simultaneous optical and electrical trap filling (OE trap filling)) for 5 min at 86 K. After waiting for 10 min for the discharging current to decrease to a negligible level, the device was heated at a constant rate of 10 K $min^{-1}$ to 320 K with a zero bias, while recording the current. After that, the same device was cooled to 86 K again. The device was biased under the same electric field (that is, an E trap filling) for 5 min, and the procedure described above was followed to record the released current. For fractional TSC measurements, the device ITO/β-PFO (1.32%) (400 nm)/Au was installed in a cryostat and then irradiated by a xenon lamp under an electric field of $5.3 \times 10^5$ V cm$^{-1}$ for 5 min at 86 K to fill the traps. After that, the cryostat was heated to a temperature ($T_{stop}$) and then cooled down to 86 K. Subsequently, a TSC plot was directly collected from 86 to 180 K with a constant heating rate of 10 K min$^{-1}$. This device was again cooled down to 86 K after the measurement. The same procedures were applied to collect TSC spectra at other $T_{stop}$s.

6. Cyclic Voltammetry Measurements.

CV measurements were performed with a potentiostat (from Autolab, Eco Chemie BV) and a one-component three-electrode electrochemical cell in a 0.1 M tetrabutylammonium percolate ($Bu_4NClO_4$) solution in acetonitrile at room temperature under atmospheric conditions. ITO glass was used as the working electrode; a platinum plate and a saturated calomel electrode (SCE) were used as the counter and reference electrodes, respectively. While collecting CV readings, an ITO glass with PFO film (100 nm, formed by spin-coating) was dipped in an electrolyte solution containing very little (ca. 5 mg) ferrocene (used as an internal standard and also as a basis to calculate HOMO levels of PFOs). The scanning rate was set to 100 mV s$^{-1}$.

Although the present invention has been described with reference to specific details of certain embodiments thereof, it is not intended that such details should be regarded as limitations upon the scope of the invention except as and to the extent that they are included in the accompanying claims. Many modifications and variations are possible in light of the above disclosure.

The invention claimed is:

1. A method of increasing β-phase content in a conjugated polymer comprising contacting a film of a conjugated polymer comprising a backbone comprising a repeating unit of substituted fluorene with a mixed liquid of a solvent and a nonsolvent of said conjugated polymer for a period of time which is sufficiently long so that the contacted conjugated polymer has a content of β phase higher than that of said conjugated polymer prior to said contacting, wherein:
said polymer is poly(9,9-di-n-octyl-2,7-fluorene) (PFO);
said solvent is tetrahydrofuran and said nonsolvent is methanol; and
said mixed liquid has a volume ratio of tetrahydrofuran to methanol ranging from 1:1 to 1:2.

2. The method according to claim 1, wherein said contacting comprises dipping said conjugated polymer film in said mixed liquid for said period of time.

3. The method according to claim 1, wherein said mixed liquid does not dissolve said conjugated polymer film to a detectable extent after said contacting.

4. The method according to claim 1, further comprising depositing a layer of said conjugated polymer on a substrate before said contacting.

5. The method according to claim 4, wherein said depositing comprises spin coating, screen printing, doctor-blade coating, ink jet printing or soft lithograpohy.

6. The method according to claim 1, wherein said period of time is from 10 to 600 seconds.

7. The method according to claim 1, wherein said conjugated polymer before said contacting is amorphous and has a not measurable β-phase content, and the contacted conjugated polymer has an increased β-phase content up to 1.32%, as estimated from an area fraction of UV-vis absorption characteristic peak.

8. The method according to claim 1, wherein said contacting comprises spraying said mixed liquid to said conjugated polymer film by spin-coating, drop-coating, screen-printing, doctor-blade coating, ink-jet printing, or soft-lithography.

9. A process for preparing a polymer light emitting diode (PLED) comprising
forming a positive electrode on a substrate;
forming a light emitting layer on said positive electrode; and
forming a negative electrode on said light emitting layer, wherein:
said light emitting layer comprises a conjugated polymer comprising a backbone comprising a repeating unit of substituted fluorene, the improvement comprising contacting said light emitting layer with a mixed liquid of a solvent and a nonsolvent of said conjugated polymer for a period of time which is sufficiently long so that the contacted conjugated polymer has a content of β phase higher than that of said conjugated polymer prior to said contacting;
said polymer is poly(9,9-di-n-octyl-2,7-fluorene) (PFO),
said solvent is tetrahydrofuran and the nonsolvent is methanol, and
said mixed liquid has a volume ratio of tetrahydrofuran to methanol ranging from 1:1 to 1:2.

10. The process according to claim 9, wherein said PLED further comprises an electron transporting layer between said light emitting layer and said negative electrode.

11. The process according to claim 9, wherein said PLED further comprises a hole injection layer between said positive electrode and said light emitting layer.

12. The process according to claim 9, wherein said PLED further comprises a hole transporting layer between said positive electrode and said light emitting layer.

13. The process according to claim 9, wherein said PLED further comprises a hole blocking layer between said light emitting layer and said negative electrode.

14. The process according to claim 9, wherein said contacting comprises dipping said light emitting layer in said mixed liquid for said period of time.

15. The process according to claim 9, wherein said mixed liquid does not dissolve said conjugated polymer film to a detectable extent after said contacting.

16. The process according to claim 9, wherein said contacting is carried out before said negative electrode being formed on said light emitting layer.

17. The process according to claim 9, wherein said light emitting layer is formed on said positive electrode by spin coating, screen printing, doctor-blade coating, ink jet printing or soft lithograpohy.

18. The process according to claim 9, wherein said period of time is from 10 to 600 seconds.

19. The process according to claim 9, wherein said conjugated polymer before said contacting is amorphous and having a not measurable β-phase content, and the contacted conjugated polymer has an increased β-phase content up to 1.32%, as estimated from an area fraction of UV-vis absorption characteristic peak.

20. The process according to claim 9, wherein said contacting comprises spraying said mixed liquid to said light emitting layer by spin-coating, drop-coating, screen-printing, doctor-blade coating, ink jet printing, or soft-lithography.

* * * * *